(12) United States Patent
Plagens

(10) Patent No.: US 6,333,647 B1
(45) Date of Patent: Dec. 25, 2001

(54) SENSOR WITH DYNAMIC LATCH

(75) Inventor: Mark R. Plagens, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/547,066

(22) Filed: Apr. 10, 2000

(51) Int. Cl.[7] ................................................. G11C 7/06
(52) U.S. Cl. ................................................. 327/55; 327/198
(58) Field of Search .................................. 327/51, 55, 57, 327/143, 198, 316, 323, 331, 332, 538

(56) References Cited

U.S. PATENT DOCUMENTS

| 5,151,591 | 9/1992 | Johnson et al. ............... 250/214 B |
|---|---|---|
| 5,332,931 * | 7/1994 | Crispie et al. ............... 327/55 |
| 5,539,339 * | 7/1996 | Van Rens ............... 327/51 |
| 5,619,137 | 4/1997 | Vig et al. ............... 324/251 |
| 6,100,740 * | 8/2000 | Pascucci ............... 327/208 |

* cited by examiner

*Primary Examiner*—Toan Tran
(74) *Attorney, Agent, or Firm*—Marshall, Gerstein & Borun; Andrew A. Abeyta

(57) ABSTRACT

A sensor with a dynamic latch comprising having a sensor coupled to a gain amplifier, a delay circuit connected to the gain amplifier and a summing circuit coupled through first and second nodes to the gain amplifier. The sensor with a dynamic latch further comprises an output stage coupled to a comparator circuit and the summing circuit and to third and fourth nodes and first and second energy storing devices coupled to the comparator circuit.

24 Claims, 3 Drawing Sheets

STROBED, LATCH OUTPUT

RECONSTRUCTED OUTPUT

US 6,333,647 B1

SENSOR WITH DYNAMIC LATCH

BACKGROUND OF THE INVENTION

The present invention relates generally to a sensor with a dynamic latch and more particularly to a sensor with a dynamic memory to allow for full performance with low power and multiplexed applications.

Low power sensors are used in a variety of applications where the conservation of supply current is a priority, such as in battery-operated equipment. An exemplary low power sensor is a magnetic sensor which uses, for example, a Hall effect element for the transducer, and which provides broad versatility in position sensing applications. For example, a Hall sensor could sense the proximity of a small magnet in a cellular flip-phone. When the cover is opened, the sensor signals the cell phone controller to begin the appropriate actions desired by the user, such as illumination of the keyboard. Subsequently, closure of the cover terminates the phone call and returns the phone to a low power, standby state awaiting incoming calls. Typically, the Hall effect sensor also provides a "hysteresis" function for such position-sensing applications, toggling its magnetic threshold between an "Operate" (ON) level and a "Release" (OFF) level. This function tends to eliminate the output uncertainty arising from vibrations or electrical noise as the sensor approaches its switching point.

Ideally, the standby state of sensors in such a system requires "zero" current for optimum battery life. Present approaches for power conservation employ on-chip clock circuitry that momentarily activates the sensing circuitry for a small percentage of the duty cycle. Thus, the average current utilized by these devices is much lower than a similar device with continuous excitation. However, the clock circuit and some form of memory to "recall" the last state of the sensor need continuous power to achieve the aforementioned hysteresis function.

A photodetector circuit described by Johnson et al. in U.S. Pat. No. 5,151,591 and a Hall circuit implemented by Vig in U.S. Pat. No. 5,619,137 are two examples of strobed sensors in which power is periodically applied by a system controller. However, the designs according to these patents do not have the necessary elements for full performance with complete interruption of the power source.

The present invention allows complete power-down during OFF periods by providing a "dynamic" memory (or a memory that "refreshes" with momentary power application).

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

According to one aspect of the present invention, a sensor dynamic latch arrangement comprises a sensor, first and second nodes coupled to the sensor, a regenerative latch, and an output stage. The regenerative latch is arranged to couple the first and second nodes to third and fourth nodes. The regenerative latch provides output signals on the third and fourth nodes dependent upon input conditions on the first and second nodes. The regenerative latch is arranged to remember the output signals upon a power interruption, and the regenerative latch is arranged to regenerate the input conditions and the output signals following the power interruption. The output stage is coupled to the third and fourth nodes.

According to another aspect of the present invention, a sensor dynamic latch arrangement comprises a sensor, a summer, a regenerative latch, and an output stage. The summer has a first input coupled to the sensor. The regenerative latch is coupled between an output of the summer and a second input of the summer and having an output. The regenerative latch is arranged to remember a signal on its output upon a power interruption, and to regenerate the signal following the power interruption. The output stage is coupled to the output of the regenerative latch.

According to a further aspect of the present invention, a sensor dynamic latch arrangement comprises first and second input nodes, first and second output nodes, a sensor, first and second amplifiers, and first and second energy storage devices. The sensor is coupled to the first and second input nodes. The first amplifier is coupled between the first input node and the second output node, and the second amplifier is coupled between the second input node and the first output node. The first energy storage device is coupled to the first output node and the second energy storage device is coupled to the second output node so that the first and second energy storage devices remember signals on the first and second output nodes upon a power interruption, and so that the first and second energy storage devices regenerate the signals on the first and second output nodes following the power interruption.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

Figure 1:
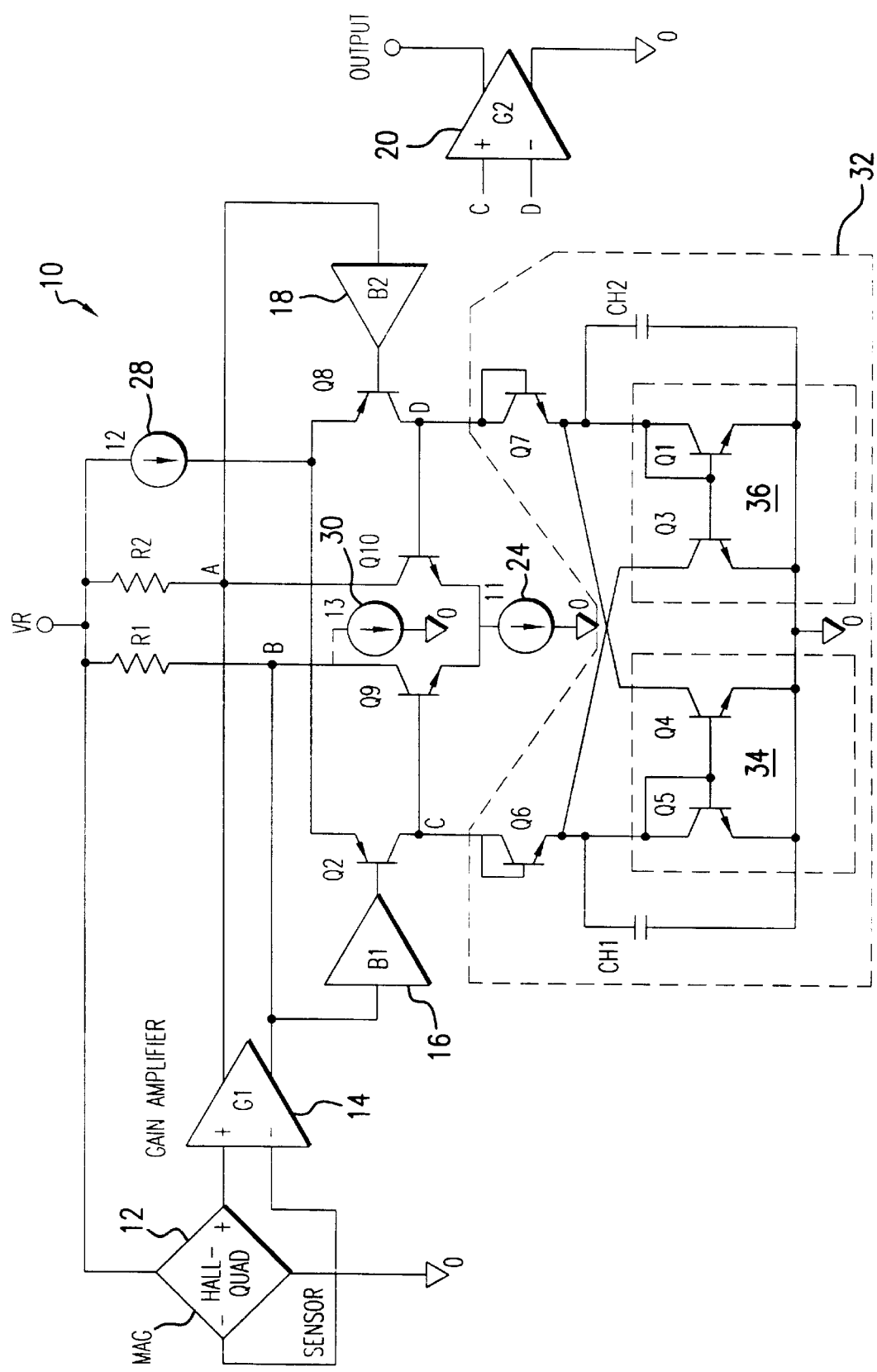
FIG. 1 is schematic diagram of a sensor dynamic latch arrangement according to the present invention.

A sensor dynamic latch arrangement 10 according to the present invention is shown in FIG. 1. The sensor dynamic latch arrangement 10 includes a sensor 12, a gain amplifier 14, level shifters 16 and 18, an output stage 20, a first current source 24, a second current source 28, nodes A and B, current steering transistors Q9 and Q10, and a current comparator circuit 32. The sensor 12 is shown in FIG. 1 as being a Hall-effect sensor. However, the sensor 12 can be any type of sensor and is not limited to the Hall-effect sensor shown in FIG. 1. The gain amplifier 14 can be of any suitable type known in the art and is provided to amplify the output of the sensor 12.

The node B sums currents from one of the outputs of the gain amplifier 14, from the resistor R1, and from the steering transistor Q9. The node A sums currents from the other of the outputs of the gain amplifier 14, from the resistor R2, and from the steering transistor Q10. The level shifters 16 and 18 serve to adjust the output of the gain amplifier 14 to a level that is suitable for use by the remainder of the sensor dynamic latch arrangement 10. The output stage 20 serves to provide an output from the sensor dynamic latch arrangement 10.

The node B is coupled through the level shifter 16 to the base of the is transistor Q2 whose emitter is connected to the second current source 28, and whose collector is connected to a node C and to an input of a diode Q6 of the current comparator circuit 32. The node A is coupled through the level shifter 18 to the base of the transistor Q8 whose emitter is connected to the second current source 28, and whose collector is connected to a node D and to an input of a diode Q7. The steering transistor Q9 has its base connected to the node C, its emitter connected to the first current source 24, and its collector connected to the summing node B. The steering transistor Q10 has its base connected to the node D, its emitter connected to the first current source 24, and its collector connected to the summing node A. The transistors Q2 and Q8 act as transconductance amplifiers in that they convert voltage signals to current signals.

The current comparator circuit 32 comprises current mirrors 34 and 36, the diodes Q6 and Q7, and first and second energy storage devices CH1 and CH2. The current mirror 34 includes transistors Q4 and Q5 having their bases connected together and to an output of the diode Q6, and their emitters connected together and to a reference potential such as ground. The collector of the transistor Q4 is connected to the output of diode Q7, and the collector of the transistor Q5 is connected to the output of the diode Q6. The current mirror 36 includes transistors Q1 and Q3 having their bases connected together and to the output of the diode Q7, and their emitters connected together and to the reference potential. The collector of the transistor Q3 is connected to the output of the diode Q6, and the collector of the transistor Q1 is connected to the output of the diode Q7. The first energy storage device CH1 is connected across the collector and emitter circuit of the transistor Q5. The second energy storage device CH2 is connected across the collector and emitter circuit of the transistor Q1. Although the first and second energy storage devices CH1 and CH2 are shown in FIG. 1 as capacitors, they can be any energy storage devices known in the art. A third current source 30 is optional for unipolar applications where a fixed offset is required. A supply VR can be provided as an on-chip regulated voltage supply.

The sensor dynamic latch arrangement 10 can be used, for example, in low power battery applications. In such applications, load current is managed by intermittently "polling" (strobing) various sensors and subsystems to determine if action is requested. Ideally, the standby or "sleep" mode for the sensors and subsystems requires ZERO current for optimum battery life. Current Hall-effect switches used in similar applications have built-in timers that power the devices in a low, duty cycle mode, significantly lowering the average current required by the unit, but still needing continuous power for proper operation. The sensor dynamic latch arrangement 10 allows complete power-down during "OFF" periods by providing a "dynamic" memory (or a memory that "refreshes" with momentary power application).

The sensor 12 senses a condition such as a magnetic field and drives the outputs of the gain amplifier 14 depending upon the polarity and/or magnitude of the condition. If the gain amplifier 14 drives the node A higher than the node B, for example, the transistor Q8 is driven out of conduction and the transistor Q2 is driven into conduction. The high gain provided by current comparator 32 coupled with the positive feedback provided by the transistors Q9 and Q10 assure that the transistors Q2 and Q8 switch. With the transistor Q8 off and the transistor Q2 on, the voltage at node C goes high, and the voltage at node D goes low. The high on the node C charges the first energy storage device CH1 and also drives the current mirror 34 into conduction, while the low on the node D drives the current mirror 36 out of conduction. When the current mirror 34 conducts, the energy storage device CH2 discharges.

If power is removed at this point, no transistors conduct and the diodes Q6 and Q7 block discharge of the first and second energy storage devices CH1 and CH2. When power is reapplied, the energy stored in the first energy storage device CH1 drives the current mirror 34 into conduction which causes a somewhat higher voltage to appear on the node C than on the node D. This voltage difference is amplified by the transistors Q9 and Q10 and is provided as positive feedback to cause the transistor Q8 to snap out of conduction and the transistor Q2 to snap into conduction. Accordingly, the state that the sensor dynamic latch arrangement 10 was in at power interruption is regenerated when power is resumed.

The sensor dynamic latch arrangement 10 operates oppositely when the gain amplifier 14 drives the node A lower than the node B. The optional third current source 30 can be used to provide a "hysteresis" for switching the transistors Q2 and Q8.

The nodes C and D are the latch "outputs" that are connected to the output stage 20.

The symmetry of the sensor dynamic latch arrangement 10 works well under dynamic supply conditions. The first and second energy storage devices CH1 and CH2 provide the "memory" of the sensor dynamic latch arrangement 10. The diodes Q6 and Q7 block discharge of the first and second energy storage devices CH1 and CH2 during Power-Off periods of the voltage supply VR. Thus, as the output of the voltage supply VR increases with the next power-on cycle, the first or second energy storage device CH1 or CH2 with the higher terminal voltage (largest charge) forces the sensor dynamic latch arrangement 10 to regenerate its last state. Also, when the sensor dynamic latch arrangement 10 regenerates its last state, the charge on the first and second energy storage devices CH1 and CH2 is refreshed. Consequently, the voltage difference across the nodes A and B will be reset to their previous condition based on the currents from the second current source 28 and, optionally, the current from the optional third current source 30.

Figure 2:
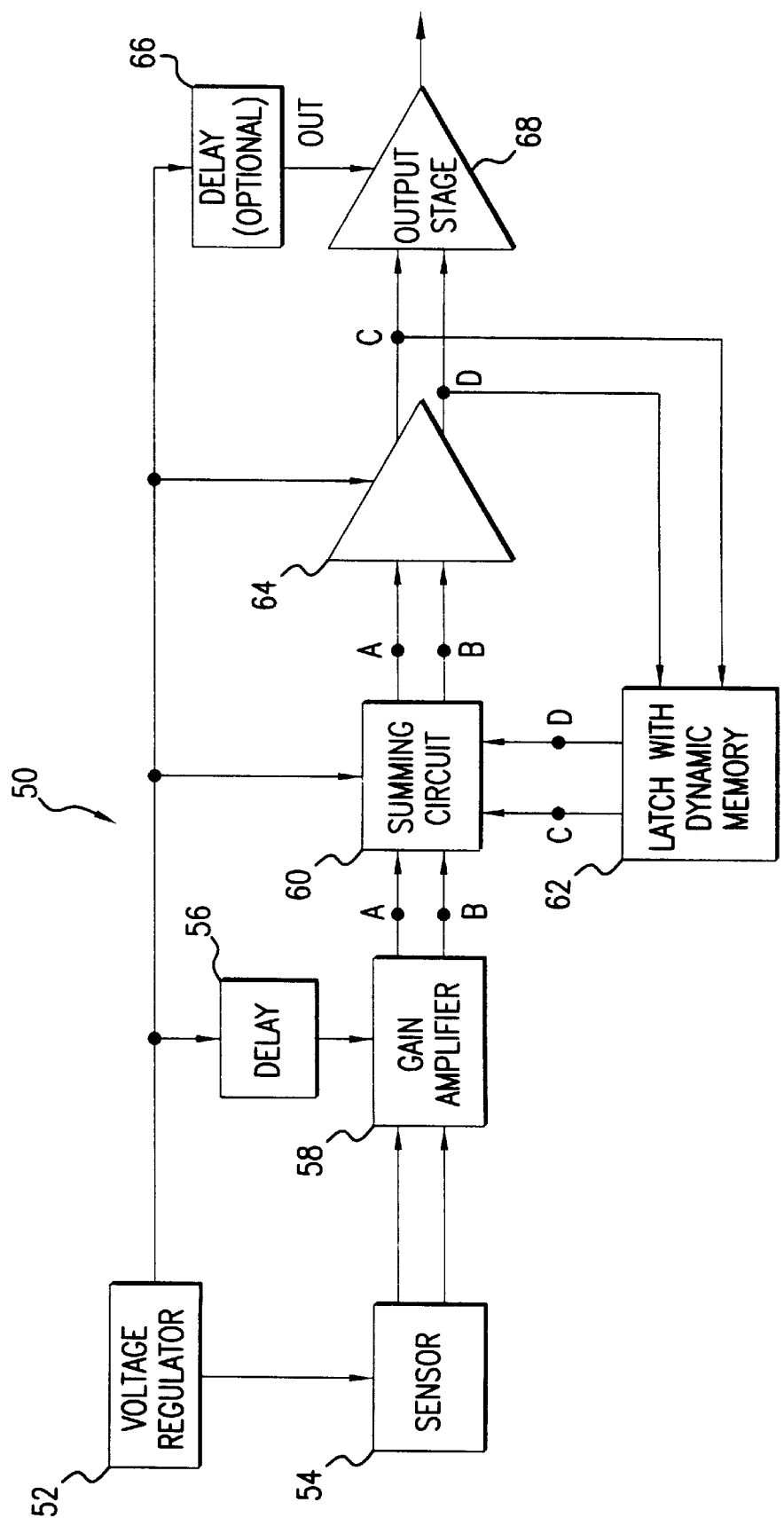
FIG. 2 is a generalized block diagram of a sensor dynamic latch arrangement according to the present invention.

The dynamic latch sensor arrangement 10 of FIG. 1 can be generalized as shown by a dynamic latch sensor arrangement 50 depicted in FIG. 2. The dynamic latch sensor arrangement 50 includes a voltage regulator 52, a sensor 54, a delay circuit 56, a gain amplifier 58, a summing circuit or summer 60, latch 62, a transconductance amplifier 64, an optional delay 66, and an output stage 68. A signal from the sensor 54 is amplified by the gain amplifier 58 and is summed with other currents (such as the collector currents from the transistors Q9 and Q10 at nodes A and B shown in FIG. 1) by the summer 60 (which is comprised, for example, of the resistors R1 and R2 shown in FIG. 1). The outputs of the summer 60 nodes A and B are amplified by the transconductance amplifier 64 and are provided to the output stage 68 at nodes C and D. Also, outputs of the summer 60 are applied to the latch 62 at nodes C and D which remembers the output states during power interruption. When power is resumed, the latch 62 causes the summer 60 and the transconductance amplifier 64 via nodes C and D to regenerate the states they were in immediately prior to the power interruption. The delay circuit 56 prevents the immediate operation of the gain amplifier 58, thus preventing the output signals on sensor 54 from influencing the voltages on nodes A and B during this regeneration cycle.

In general, the operate and release states are separated sufficiently by hysteresis so as to prevent oscillation of the output due to electrical noise, mechanical vibrations, or other causes. (For example, the operate point, B_operate (shown in FIG. 3), may be equal to +150 Gauss, and the release point, B_release (shown in FIG. 3), may be equal to −150 Gauss.) This hysteresis is provided by the dynamic latch sensor arrangement 50 having positive (regenerative) feedback through the loop formed by the summer 60, the transconductance amplifier 64, and latch 62. Specifically, the magnitude of the hysteresis, which is set by the first current source 24 and the value of the resistor R1, assuming R1 and R2 have substantially the same resistance, is given by the following expression:

$$Vhysteresis/2 = I1 \times R1.$$

For proper operation in a strobed, low duty cycle mode, the status of the latch 62 should be reset correctly upon re-application of power such that the appropriate comparator threshold can be sent to the summer 60. (For example, if the magnetic field was greater than +150 Gauss during the last sampling period, the threshold should remain at −150 Gauss until the appropriate negative field is sensed). Therefore, the latch 62 remembers its last state so that the updated amplifier output can be compared to the appropriate threshold and the 'hysteresis' function is preserved.

Figure 3:
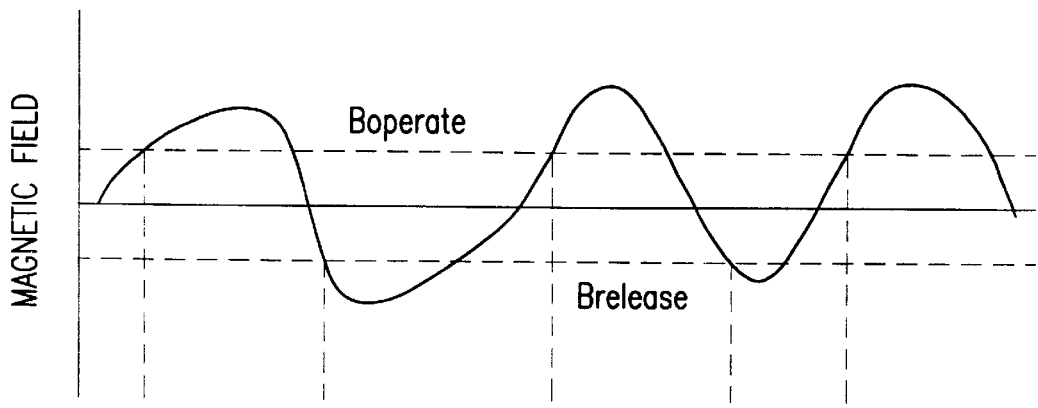
FIG. 3 is a wave diagram of a magnetic field used to operate a sensor of the sensor dynamic latch arrangement according to the present invention.
Figure 4:
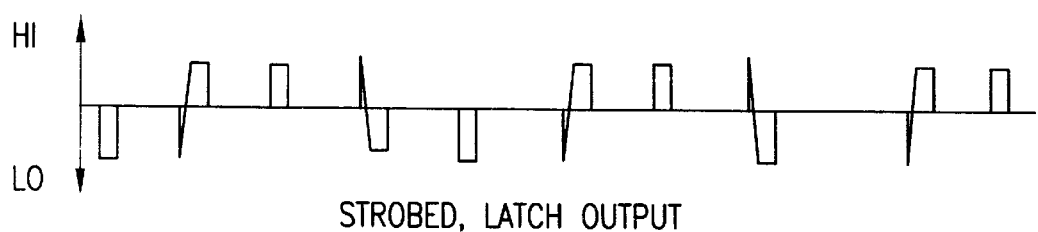
FIG. 4 is a wave diagram of the output of a latch of the sensor dynamic latch arrangement according to the present invention; and, FIG. 5 is wave diagram of the reconstructed output of the sensor dynamic latch arrangement according to the present invention.
Figure 5:
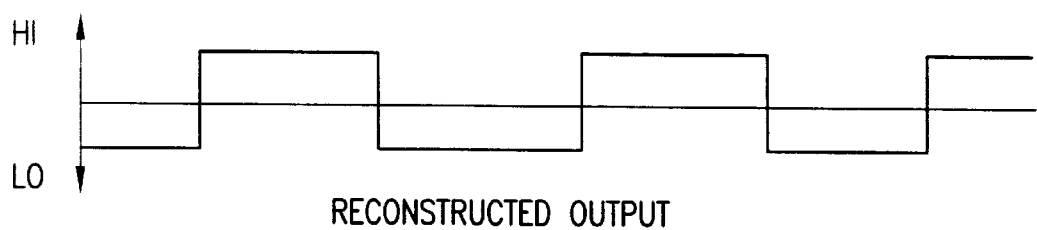

This operation is demonstrated by the exemplary wave diagrams of FIGS. 3–5. FIG. 3 is a wave diagram of a magnetic field used to operate the sensor 54 if it is assumed that the sensor is the type to be operated by a magnetic field. FIG. 4 is a wave diagram of the output of the latch 62. FIG. 5 is wave diagram of the reconstructed output of the transconductance amplifier 64.

As shown in FIGS. 3–5, the latch 62 returns to its previous state during each strobe period. If, however, the magnetic field produces an output change, the latch 62 quickly moves to its new, correct condition. An optional delay provided by the optional delay 66 can be introduced at the output stage 68 in order to prevent the momentary latch states of the latch 62 from propagating to the output terminal. The reconstructed output represents the magnetic field status determined by a system control function utilizing the sampled data points.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A sensor dynamic latch arrangement comprising:

a sensor;

first and second nodes coupled to the sensor;

a regenerative latch arranged to couple the first and second nodes to third and fourth nodes, wherein the regenerative latch provides output signals on the third and fourth nodes dependent upon input conditions on the first and second nodes, wherein the regenerative latch is arranged to remember the output signals upon a power interruption, and wherein the regenerative latch is arranged to regenerate the input conditions and the output signals following the power interruption; and, an output stage coupled to the third and fourth nodes.

2. The sensor dynamic latch arrangement of claim 1, wherein the sensor comprises a gain amplifier.

3. The sensor dynamic latch arrangement of claim 1, wherein the first and second nodes are summing nodes arranged to sum outputs from the sensor with feedback currents from the regenerative latch.

4. The sensor dynamic latch arrangement of claim 1, wherein the regenerative latch comprises first and second transistors, wherein the first transistor is coupled between the first and fourth nodes, and wherein the second transistor is coupled between the second and third nodes.

5. The sensor dynamic latch arrangement of claim 4, wherein the regenerative latch further comprises first and second current mirrors and first and second storage devices, wherein the first and second current mirrors and the first and second storage devices are coupled to the third and fourth nodes so that the first and second storage devices remember the input conditions and the output signals upon a power interruption and so that the first and second storage devices cause regeneration of the input conditions and the output signals following the power interruption.

6. The sensor dynamic latch arrangement of claim 5, wherein the first current mirror and the first storage device are coupled to the third node, and wherein the second current mirror and the second storage device are coupled to the fourth node.

7. The sensor dynamic latch arrangement of claim 4, wherein the regenerative latch further comprises first and second storage devices, wherein the first and second storage devices are coupled to the third and fourth nodes so that the first and second storage devices remember the input conditions and the output signals upon a power interruption and so that the first and second storage devices cause regeneration of the input conditions and the output signals following the power interruption.

8. The sensor dynamic latch arrangement of claim 7, wherein the first storage device is coupled to the third node, and wherein the second storage device is coupled to the fourth node.

9. The sensor dynamic latch arrangement of claim 1, wherein the regenerative latch comprises first and second transistors, wherein a base of the first transistor is coupled to the first node, wherein a collector and emitter circuit of the first transistor is coupled to the fourth node, wherein a base of the second transistor is coupled to the second node, and wherein a collector and emitter circuit of the second transistor is coupled to the third node.

10. The sensor dynamic latch arrangement of claim 9, wherein the regenerative latch further comprises first and second current mirrors and first and second storage devices, wherein the first current mirror and the first storage device are coupled to the third node, wherein the second current mirror and the second storage device are coupled to the fourth node, wherein the first and second storage devices remember the input conditions and the output signals upon a power interruption, and wherein the first and second storage devices cause regeneration of the input conditions and the output signals following the power interruption.

11. The sensor dynamic latch arrangement of claim 9, wherein the regenerative latch further comprises third and fourth transistors, wherein a base of the third transistor is coupled to the fourth node, wherein a collector and emitter circuit of the third transistor is coupled to the second node, wherein a base of the fourth transistor is coupled to the third node, and wherein a collector and emitter circuit of the fourth transistor is coupled to the first node.

12. The sensor dynamic latch arrangement of claim 11, wherein the regenerative latch further comprises first and second current mirrors and first and second storage devices, wherein the first current mirror and the first storage device are coupled to the third node, wherein the second current mirror and the second storage device are coupled to the fourth node, wherein the first and second storage devices remember the input conditions and the output signals upon a power interruption, and wherein the first and second storage devices cause regeneration of the input conditions and the output signals following the power interruption.

13. A sensor dynamic latch arrangement comprising:
   a sensor;
   a summer having a first input coupled to the sensor;
   a regenerative latch coupled between an output of the summer and a second input of the summer and having an output, wherein the regenerative latch is arranged to remember a signal on its output upon a power interruption, and wherein the regenerative latch is arranged to regenerate the signal following the power interruption; and,
   an output stage coupled to the output of the regenerative latch.

14. The sensor dynamic latch arrangement of claim 13, wherein the sensor comprises a gain amplifier.

15. The sensor dynamic latch arrangement of claim 13, further comprising a delay circuit arranged to prevent an immediate operation of the gain amplifier so as to prevent the sensor from influencing voltages on nodes of the summer during regeneration.

16. The sensor dynamic latch arrangement of claim 13, wherein the regenerative latch comprises a transconductance amplifier coupled between the output of the summer and the output stage.

17. The sensor dynamic latch arrangement of claim 16, wherein the transconductance amplifier comprises positive feedback.

18. The sensor dynamic latch arrangement of claim 13, wherein the regenerative latch comprises a storage device, wherein the storage device remembers the signal upon a power interruption and causes regeneration of the signal following the power interruption.

19. The sensor dynamic latch arrangement of claim 18, wherein the regenerative latch comprises a transconductance amplifier coupled between the output of the summer and the output stage.

20. The sensor dynamic latch arrangement of claim 19, wherein the transconductance amplifier comprises positive feedback.

21. A sensor dynamic latch arrangement comprising:
   first and second input nodes;
   first and second output nodes;
   a sensor coupled to the first and second input nodes;
   a first amplifier coupled between the first input node and the second output node;
   a second amplifier coupled between the second input node and the first output node; and,
   first and second energy storage devices, wherein the first energy to storage device is coupled to the first output node and wherein the second energy storage device is coupled to the second output node so that the first and second energy storage devices remember signals on the first and second output nodes upon a power interruption, and so that the first and second energy storage devices regenerate the signals on the first and second output nodes following the power interruption.

22. The sensor dynamic latch arrangement of claim 21 comprising positive feedback for the first and second amplifiers.

23. The sensor dynamic latch arrangement of claim 21, wherein the first and second energy storage devices include first and second current mirrors, wherein the first current mirror is coupled to the second output node and to the first energy storage device and is arranged to control storage of the signal by the first energy storage device, and wherein the second current mirror is coupled to the first output node and to the second energy storage device and is arranged to control storage of the signal by the second energy storage device.

24. The sensor dynamic latch arrangement of claim 23 comprising positive feedback for the first and second amplifiers.

* * * * *